United States Patent [19]

Koyama

[11] Patent Number: 5,760,892
[45] Date of Patent: Jun. 2, 1998

[54] METHOD OF ANALYZING FAILURE OF SEMICONDUCTOR DEVICE BY USING EMISSION MICROSCOPE AND SYSTEM FOR ANALYZING FAILURE OF SEMICONDUCTOR DEVICE

[75] Inventor: Tohru Koyama, Tokyo, Japan

[73] Assignee: Mitsubishi Denki Kabushiki Kaisha, Tokyo, Japan

[21] Appl. No.: 767,640

[22] Filed: Dec. 17, 1996

[30] Foreign Application Priority Data

Jun. 14, 1996 [JP] Japan ................... 8-154015

[51] Int. Cl.$^6$ .................................... G01N 21/00
[52] U.S. Cl. ............. 356/237; 356/71; 356/429; 356/388; 356/390
[58] Field of Search ............... 356/237, 71, 429, 356/388, 390

[56] References Cited

U.S. PATENT DOCUMENTS 5,301,006  4/1994  Bruce ........................ 356/328
5,377,003  12/1994 Lewis et al. ............. 250/339.02

OTHER PUBLICATIONS

Kiyoshi Nikawa, "Failure Analysis on Si Device Chips", IEICE Transactions on Electronics, (pp. 528–534), vol. E77–C, No. 4, Apr. 1994.

S. Ishikasa, et al., "Yield Enhancement by FBM analysis system", Reference for the Research by Gakushin 132 commitee, (pp. 1–6), Nov., 1995.

*Primary Examiner*—David C. Nelms
*Assistant Examiner*—Reginald A. Ratliff
*Attorney, Agent, or Firm*—Oblon, Spivak, McClelland, Maier & Neustadt, P.C.

[57] ABSTRACT

A method of analyzing a failure of semiconductor device by using an emission microscope for easy analysis of current leakage is disclosed. Light emission information is stored in X/Y memory spaces (16), with a Z direction indicating an emitted light intensity. A light emission presence bit (17) in the light emission information means a bit for which light emission is judged as being present, and the number of light emission presence bits is determined on the basis of the emitted light intensity. An image memory (11) has a three-dimensional memory space including an X/Y space indicative of plane positions of light emitting portions and a Z space indicative of the emitted light intensity. The position and intensity of light emission are detected by searching the light emission information stored in the image memory (11) to analyze the failure.

9 Claims, 8 Drawing Sheets

5,760,892

1

METHOD OF ANALYZING FAILURE OF SEMICONDUCTOR DEVICE BY USING EMISSION MICROSCOPE AND SYSTEM FOR ANALYZING FAILURE OF SEMICONDUCTOR DEVICE

BACKGROUND OF THE INVENTION

1. Field of the Invention

The present invention relates to a method of analyzing a failure by using an emission microscope used for failure analysis of a semiconductor device such as an LSI device, and a system for analyzing a failure of a semiconductor device.

2. Description of the Background Art

For semiconductor devices such as LSI circuits, the occurrence of a current leakage failure becomes more serious as devices become finer and include more multiple layers. This results from the reduction in process/structural margin due to the device size reduction, and the increase in particles and pattern defects because of the increasing number of manufacturing processes. The current leakage failure truly reflects malfunctions in respective stages of circuit design to manufacturing process. Thus, the causes of the current leakage failure are various and wide-ranging. In some cases, much time is spent in tracking down the causes of the current leakage failure.

Solution to the causes of the current leakage begins with determination of a leakage portion. An emission microscope (abbreviated as "EMS" hereinafter) has been hitherto used to determine the leakage portion.

The EMS is a photodetector which is capable of detecting very faint photon-level light. The EMS detects faint light produced in the leakage portion to output the position and intensity of the light as a two-dimensional image. This emission image may be outputted, with a pattern image superimposed thereon. This allows the determination of the leakage portion.

FIG. 8 schematically illustrates an EMS device. As shown in FIG. 8, an operating voltage is applied to a sample chip 1 which is a semiconductor device to place the sample chip 1 in operation. Light 3 (or photons) produced from a current leakage portion 2 in the sample chip 1 is passed through an optical lens 4 onto a photomultiplier 5.

The photomultiplier 5 includes a photoelectronic surface 6, an MPC (microchannel plate) 8, and a fluorescent surface 9. The photoelectronic surface 6 converts the light 3 to photoelectrons 7 which in turn are electron-multiplied by the MPC 8. The MPC 8 has a myriad of microholes having a diameter of about several to tens of microns, and the electrons are multiplied while passing through the microholes. This preserves the two-dimensional position of the light emission. The multiplied electrons are converted to light again by the fluorescent surface 9, and the converted light enters a solid-state image pickup device 10. The solid-state image pickup device 10 detects the position and intensity of the emitted light, and an image memory 11 stores the detection data therein.

An image processor 12 superimposes the data stored in the image memory 11 on a previously provided pattern image (optical reflected image) having the same visual field to output the superimposed data as an image to a monitor 13.

The position of the current leakage and the tendency of occurrence of the current leakage in a wafer surface reflect the causes of the current leakage. For example, if a mask defect or structural defect is present, the current leakage occurs at the same position in all of the chips.

2

If the current leakage results from a particle or pattern defect in a given processing of the manufacturing process, the current leakage occurs at random positions within the chip, and a leakage distribution specific to the processing appears within the wafer surface. Examples of the specific leakage distribution are such that the leakages are concentrated in the center of the wafer and such that the leakages are concentrated on the periphery of the wafer. To specify the cause of the current leakage in the EMS analysis, it is significant to detect the position of light emission within the chip in detail as well as to obtain the condition of other chips within the same wafer and the light emission distribution within the wafer surface to find the positional characteristic of light emitting portions in the chip and within the wafer surface.

Unfortunately, the conventional EMS analysis is performed such that an operator views the monitor or a printout photo to identify the light emitting portions for each chip, resulting in very low efficiency and accuracy and difficulties in finding the positional characteristic and distribution of the light emitting portions between the chip and within the wafer surface. In particular, a tendency toward increase in the number of chips due to increase in diameter of the wafer makes it more and more difficult to analyze the current leakage on the wafer level in the future.

SUMMARY OF THE INVENTION

A first aspect of the present invention is intended for a method of analyzing a failure of a semiconductor device on the basis of an emission image of the semiconductor device by using an emission microscope. According to the present invention, the method comprises the steps of: (a) storing light emission information in an image memory, the light emission information including two-dimensional position of the emission image and an emitted light intensity associated with the two-dimensional position; and (b) accessing the image memory to identify the light emission information to analyze a failure of the semiconductor device on the basis of the light emission information.

Preferably, according to a second aspect of the present invention, the step (b) includes the step of (b-1) searching and scanning each predetermined unit scanning areas in the image memory to detect a position and intensity of light emitting portions.

Preferably, according to a third aspect of the present invention, the step (b) includes the step of (b-1) searching and scanning in the image memory in descending order of emitted light intensity from a predetermined emitted light intensity to detect a position and maximum intensity of light emitting portions.

Preferably, according to a fourth aspect of the present invention, the semiconductor device includes a plurality of semiconductor devices having surfaces of the same configuration; and the step (b) includes the steps of: (b-1) accumulating light emissions of the plurality of semiconductor devices on the basis of the light emission information to produce a frequency map for displaying a frequency distribution of light emitting portions having not less than a predetermined emitted light intensity on the surfaces, and (b-2) analyzing a failure of the plurality of semiconductor devices on the basis of the frequency map.

Preferably, according to a fifth aspect of the present invention, the semiconductor device includes a plurality of semiconductor devices formed on a predetermined wafer, and the emission microscope permits identification of the positions of the plurality of semiconductor devices on the predetermined wafer; and the step (b) includes the steps of: (b-1) producing a light emission wafer map for collectively displaying light emissions of the plurality of semiconductor devices on the predetermined wafer on the basis of the light emission information. and (b-2) analyzing a failure of the plurality of semiconductor devices on the basis of the light emission wafer map.

Preferably, according to a sixth aspect of the present invention. the step (b-2) includes the steps of: (b-2-1) producing a plurality of defect wafer maps for collectively displaying defects in respective manufacturing processes on the predetermined wafer, and (b-2-2) comparing the light emission wafer map with the plurality of defect wafer maps to analyze a failure of the plurality of semiconductor devices.

Preferably, according to a seventh aspect of the present invention, the plurality of semiconductor devices include a plurality of semiconductor memories; and the step (b-2) includes the steps of: (b-2-1) producing a fail bit map for collectively displaying failed bits of the plurality of semiconductor memories on the predetermined wafer, and (b-2-2) comparing the light emission wafer map with the fail bit map to analyze a failure of the plurality of semiconductor memories.

An eighth aspect of the present invention is intended for a method of analyzing a failure of a semiconductor device by using an emission microscope. According to the present invention, the method comprises the steps of: (a) producing a light emission wafer map for collectively displaying light emissions of a plurality of semiconductor devices formed on a predetermined wafer by using the emission microscope; (b) producing defect wafer maps for collectively displaying defects in respective manufacturing processes on the predetermined wafer, the plurality of semiconductor devices including a plurality of semiconductor memories; (c) producing a fail bit map for collectively displaying failed bits of the plurality of semiconductor memories on the predetermined wafer; and (d) performing data management of the light emission wafer map, the defect wafer maps, and the fail bit map and verification of two of the light emission wafer map, the defect wafer maps, and the fail bit map against each other by using a network to analyze a failure of the plurality of semiconductor devices.

According to a ninth aspect of the present invention, a system for analyzing a failure of a semiconductor device comprises: an EMS analysis device having an emission microscope, the EMS analysis device being capable of outputting a light emission wafer map for collectively displaying light emissions of a plurality of semiconductor devices formed on a predetermined wafer by using the emission microscope; a defect check device capable of outputting defect wafer maps for collectively displaying defects in respective manufacturing processes on the predetermined wafer; the plurality of semiconductor devices including a plurality of semiconductor memories; a tester capable of outputting a fail bit map for collectively displaying failed bits of the plurality of semiconductor memories on the predetermined wafer; and a computer capable of performing data management of the light emission wafer map, the defect wafer maps, and the fail bit map and verification of two of the light emission wafer map, the defect wafer maps, and the fail bit map against each other, the emission microscope, the EMS analysis device, the defect check device, the tester and the computer constructing a network.

The method of analyzing the failure of the semiconductor device by using the emission microscope in accordance with the first aspect of the present invention includes accessing the image memory to analyze the failure of the semiconductor device on the basis of the light emission information including the two-dimensional position of the emission image and the emitted light intensity associated with the two-dimensional position while storing the light emission information in the image memory, achieving high-accuracy detection of the position and intensity of light emission without the need for operator's detailed observation.

The method in accordance with the second aspect of the present invention includes searching and scanning each predetermined unit scanning areas in the image memory on the basis of the light emission information to facilitate the identification of the light emitting positions for reduction in processing time and to substantially reduce the danger of such improper identification that a plurality of light emitting portions are present.

The method in accordance with the third aspect of the present invention includes searching and scanning in the image memory in descending order of emitted light intensity from the predetermined emitted light intensity to detect a position and maximum intensity of light emitting portions. The light emission distributions are detected sequentially in descending order of emitted light intensity.

Thus, the two-dimensional position having the maximum emitted light intensity in one light emission data area is detected. The light emitting portion is not detected as an area but as a point. This enhances the searching efficiency.

The method in accordance with the fourth aspect of the present invention includes analyzing the failure of the plurality of semiconductor devices on the basis of the frequency map provided by accumulating the light emissions of the plurality of semiconductor devices on the basis of the light emission information for displaying the frequency distribution of the light emitting portions having the predetermined emitted light intensity or more on the surface. Thus, this method may provides the positional characteristics of the light emitting portions in the plurality of semiconductor devices and facilitates the identification of the positional characteristics of the current leakage portions.

The method in accordance with the fifth aspect of the present invention includes analyzing the failure of the plurality of semiconductor devices on the basis of the light emission wafer map for collectively displaying the light emissions of the plurality of semiconductor devices on the predetermined wafer. This substantially enhances the identification of the light emission distribution within the predetermined wafer surface which have been difficult to grasp using the light emission distribution of one semiconductor device.

The method in accordance with the sixth aspect of the present invention includes comparing the light emission wafer map with the plurality of defect wafer maps for collectively displaying a defect during a manufacturing process on the predetermined wafer to analyze the failure of the plurality of semiconductor devices. If the current leakage might result from the defect in the manufacturing processes, the position coordinates of the light emission on the light emission wafer map may be verified against the position coordinates of the defects in the respective manufacturing processes on the defect wafer maps, permitting easy identification of the manufacturing process during which a defect has caused the current leakage.

The method in accordance with the seventh aspect of the present invention includes comparing the light emission wafer map with the fail bit map for collectively displaying the failed bits of the plurality of semiconductor memories on the wafer to analyze the failure of the plurality of semiconductor memories, permitting relatively easy detection of the cause of the current leakage due to the block failure and all-bit failure.

The method of analyzing the failure of the semiconductor device by using the emission microscope in accordance with the eighth aspect of the present invention includes comparing the light emission wafer map with the fail bit map for analysis, permitting relatively easy detection of the cause of the current leakage due to the block failure and all-bit failure.

Additionally, the method may generally analyze the current leakage of the semiconductor devices, such as comparison and verification between the light emission wafer map and the plurality of defect wafer maps.

The system for analyzing the failure of the semiconductor device in accordance with the ninth aspect of the present invention comprises the emission microscope, the EMS analysis device, the defect check device, the tester, and the computer all of which construct the network.

The presence of the EMS analysis device capable of outputting the light emission wafer map on the network facilitates the general analysis of the current leakage of the semiconductor devices, such as comparison and verification between the light emission wafer map and the plurality of defect wafer maps, under the control of the computer.

It is therefore an object of the present invention to provide a method of analyzing a failure of a semiconductor device by using an emission microscope which is capable of readily analyzing current leakage, and a system for analyzing a semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

Figure 1A:
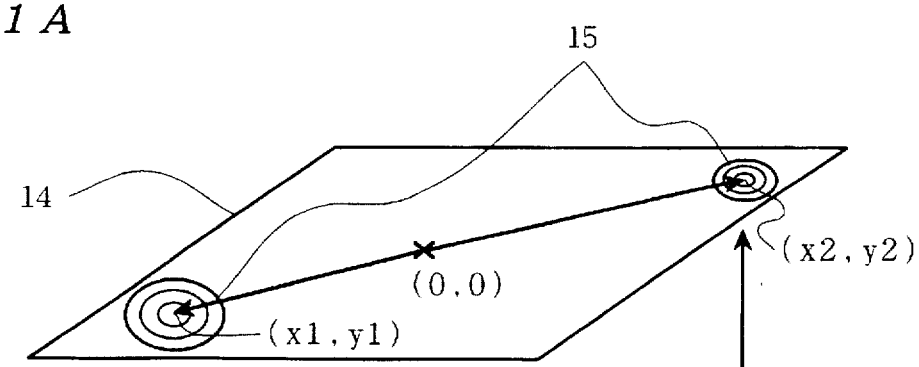
FIGS. 1A and 1B illustrate a method of analyzing a failure of a semiconductor device by using an emission microscope according to a first preferred embodiment of the present invention.
Figure 1B:
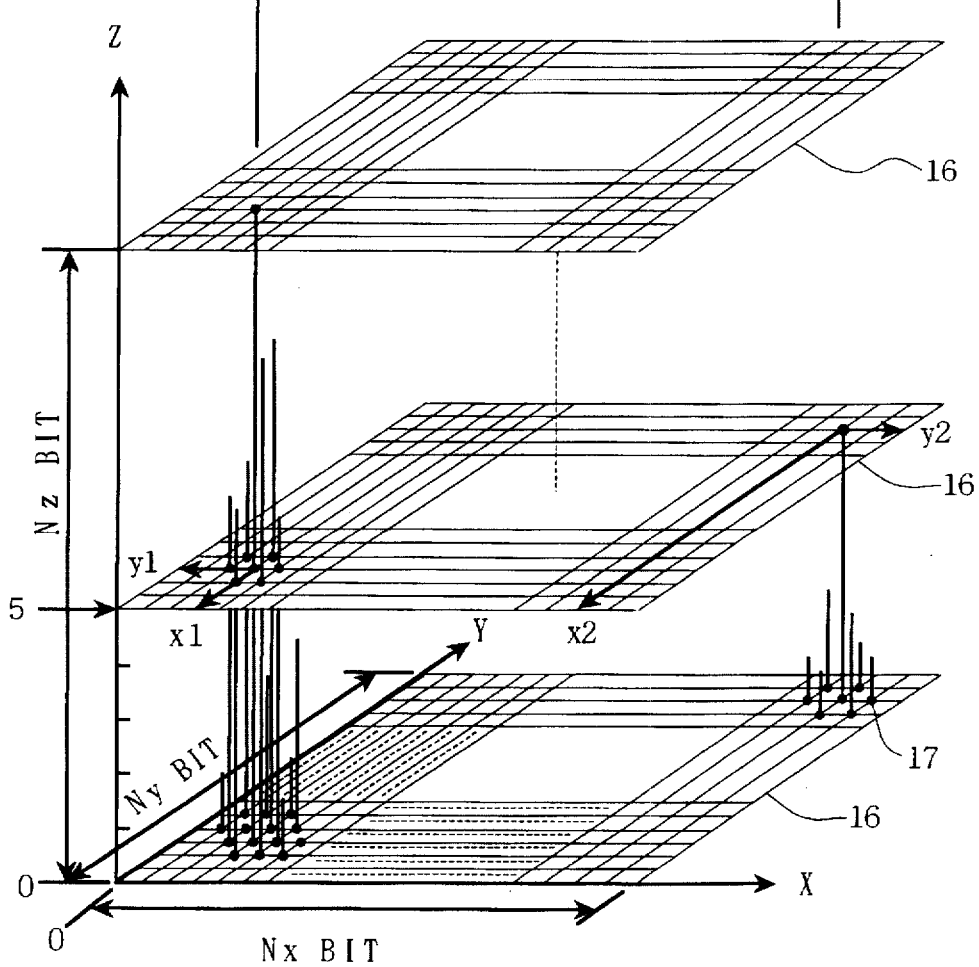
Figure 8:
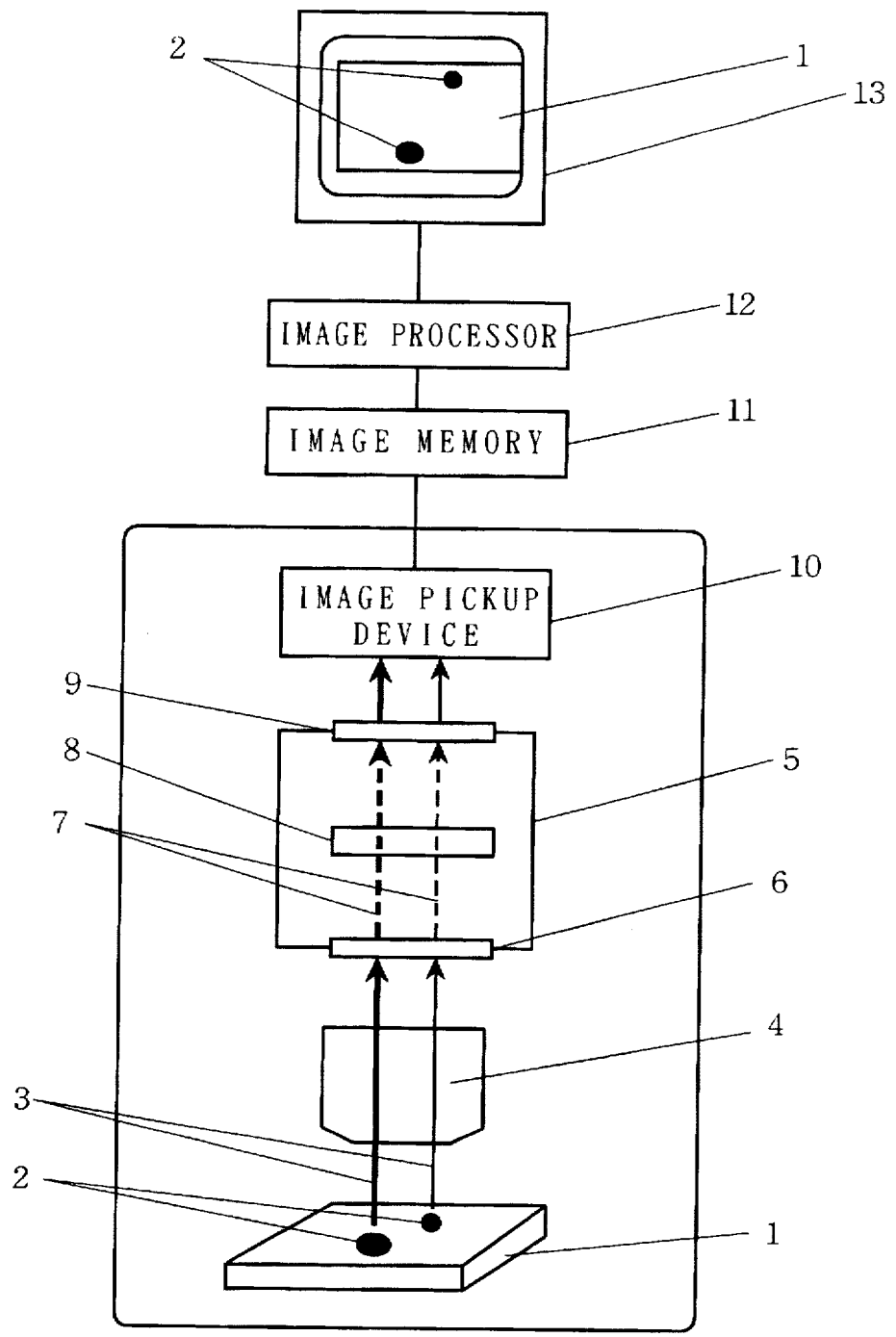
FIG. 8 schematically illustrates an EMS device.

FIGS. 1A and 1B illustrate a method of analyzing a failure of a semiconductor device by using an emission microscope according to a first preferred embodiment of the present invention. FIG. 1A shows an emission image on a monitor, and FIG. 1B shows data stored in an image memory. The hardware arrangement of the first preferred embodiment is similar to the conventional hardware arrangement shown in FIG. 8.

Referring to FIGS. 1A and 1B, light emission information is stored in X/Y memory spaces 16, with a Z direction indicating an emitted light intensity. A light emission presence bit 17 in the light emission information means a bit for which light emission is judged as being present. The number of light emission presence bits 17 is determined on the basis of the emitted light intensity. Specifically, the image memory 11 has a three-dimensional memory space, with the plane position of light emitting portions indicated by the X/Y space and the emitted light intensity indicated by the Z space. The light emission information extending three-dimensionally in accordance with the configuration and intensity of emitted light is stored in the image memory 11 as illustrated in FIG. 1B.

The bit coordinates of the plane position (X, Y) on the image memory 11 correspond to a pixel position (X, Y) in a monitor display area 14, and the information in the Z direction indicative of the intensity provides emission images 15 represented by light and shade or pseudo colors.

In the conventional method, an operator has identified the presence/absence, position and intensity of light emissions by viewing the emission images 15 as shown in FIG. 1A. In the first preferred embodiment, however, the image memory 11 is directly searched to correctly provide the position and intensity of the light emitting portions in the form of numerical values.

For example, if the X/Y space defined by the fifth bit in the Z direction in the light emission information in the image memory 11 is scanned for each bit as shown in FIG. 1B, the presence of two light emitting positions having an intensity of not less than 5 bits is identified. Then, two pairs of coordinates (x1, y1) and (x2, y2) are provided by finding the coordinates of the center of each light emitting portion. For maximum intensity, searching the detected coordinates (X, Y) in the Z direction may automatically specify the maximum intensity of each of the light emitting portions.

When a memory address of the image memory 11 is converted into physical position coordinates, the memory coordinates (monitor pixel coordinates (correlated with the memory coordinates)) of an origin previously specified within the visual field of an image and a distance (distance for each pixel) for each address determined by an optical magnification during measurement are used to detect the light emitting position as the physical position coordinates on the basis of the relationship between the address of the image memory 11 and the pixel coordinates in the monitor display area 14.

In the failure analysis method of the first preferred embodiment, as above described, the position and intensity of light emission may be readily detected with high accuracy (without operator's detailed observation) by searching the light emission information stored in the image memory 11.

<Second Preferred Embodiment>

Figure 2:
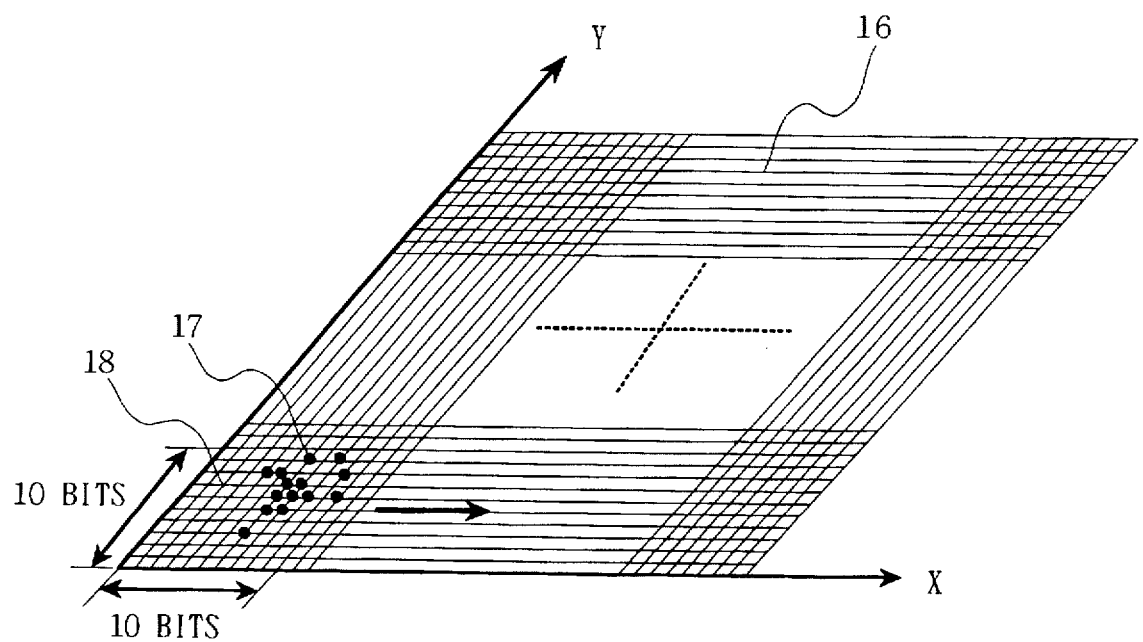
FIG. 2 illustrates the method of analyzing the failure of the semiconductor device by using the emission microscope according to a second preferred embodiment of the present invention.

FIG. 2 illustrates the method of analyzing the failure of the semiconductor device by using the emission microscope according to a second preferred embodiment of the present invention. The hardware arrangement of the second preferred embodiment is similar to the conventional hardware arrangement shown in FIG. 8.

Referring to FIG. 2, the light emission presence bits 17 are stored in the X/Y memory space 16 in the form of the light emission information stored in the image memory 11. Unit scanning areas 18 each comprised of a 10×10 bit array are established. In the second preferred embodiment, the unit scanning area 18 containing the light emission presence bit 17 exceeding the number of bits previously established for each unit scanning area 18 is automatically judged as a "light emission presence" area.

In the second preferred embodiment, as above described, searching and scanning each unit scanning area 18 having the 10×10 bit array on the basis of the light emission information stored in the image memory 11 eliminates the need for calculation of the central position and the like of the first preferred embodiment, substantially shortening the processing time.

Additionally, improper identification of the light emitting portions is reduced for reasons to be described below. The light emission information in the image memory for light emitted from one portion normally provides sparsely dotted light emission presence bits 17 as shown in FIG. 2. Light emitted from one point on the sample chip 1 is detected with certain spread in such a manner that the light emission presence bits 17 are closely spaced adjacent the center of the light emission but an area containing no light emission presence bit 17 is present in a peripheral region of the light emission.

In such a case, searching and scanning for each bit as in the first preferred embodiment might cause the presence/ absence of the light emission presence bits 17 to be identified for each bit, resulting in such improper identification that a plurality of light emitting portions are present, although only one light emitting portion is in practice present.

In the failure analysis method of the second preferred embodiment, on the other hand, the presence/absence of the light emission presence bits 17 is judged for each unit scanning area 18 having the 10×10 bit array on the basis of the light emission information, substantially reducing the danger of such improper identification that a plurality of light emitting portions are present.

<Third Preferred Embodiment>

Figure 3:
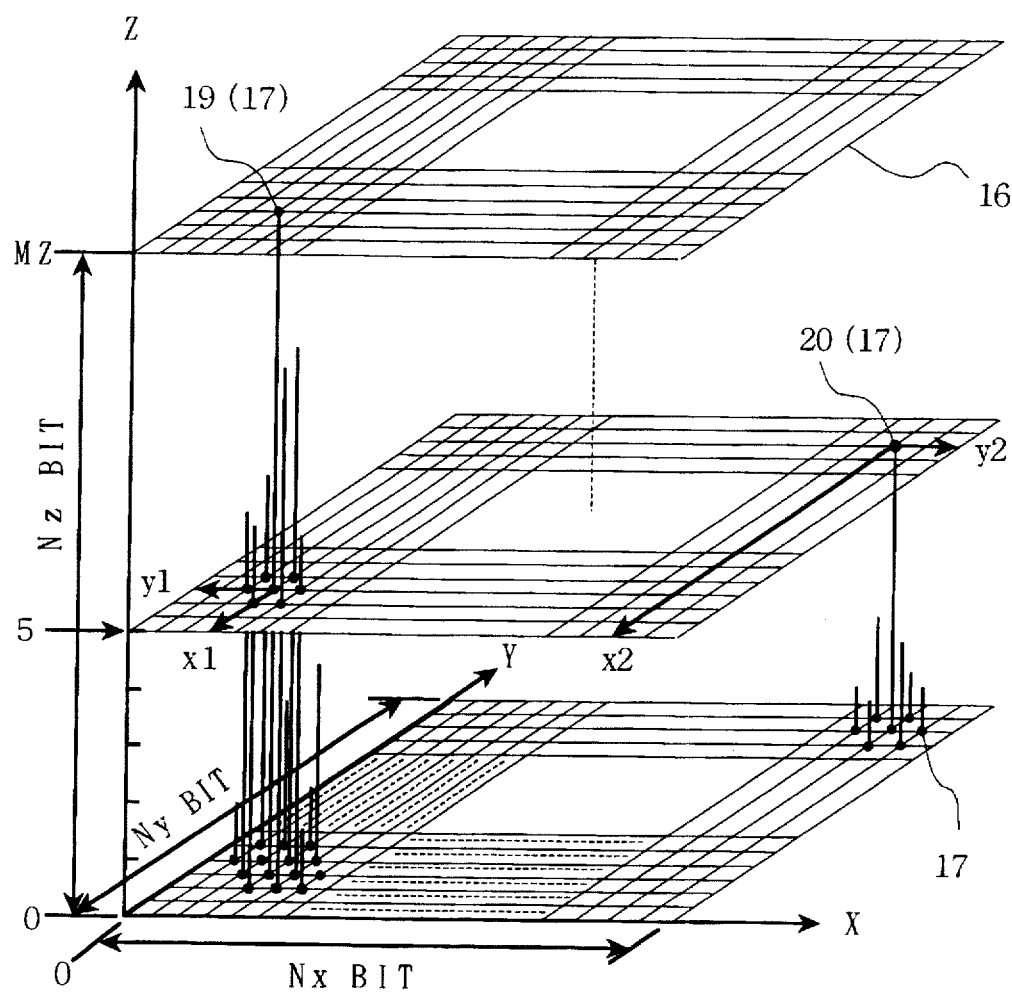
FIG. 3 illustrates the method of analyzing the failure of the semiconductor device by using the emission microscope according to a third preferred embodiment of the present invention.

FIG. 3 illustrates the method of analyzing the failure of the semiconductor device by using the emission microscope according to a third preferred embodiment of the present invention. The hardware arrangement of the third preferred embodiment is similar to the conventional hardware arrangement shown in FIG. 8.

Referring to FIG. 3, the light emission presence bits 17 are stored in the X/Y memory spaces 16.

The failure analysis method of the third preferred embodiment is a method of detecting the light emission presence bits 17 in descending order of the number of bits in the Z direction from the deepest bit (the most significant bit in the Z direction in a light emission data area). In the execution of the failure analysis method of the third preferred embodiment using the illustration of FIG. 3 as an example, a deepest light emission presence bit 19 (the number of bits MZ in the Z direction) is first detected. Then, when the number of bits in the Z direction is reduced to "5", 5-bit deep light emission presence bits 20 are detected. To prevent duplicate detection, the plane position (x, y) once detected is eliminated from the searching targets.

In the failure analysis method of the third preferred embodiment, as above described, sequentially searching and scanning the X/Y memory spaces of the image memory 11 in descending order of bits from the deepest bit permit sequential detection in the descending order of emitted light intensity. Since the bit having the maximum emitted light intensity in one light emission data area is detected, the light emitting portion is detected as a point, not as an area.

As a result, the plane position (x, y) of the detected light emission presence bit 17 and the number of bits in the Z direction are used as the coordinates of the center of the light emitting portion and the emitted light intensity thereof, respectively. This enhances the searching efficiency.

<Fourth Preferred Embodiment>

Figure 4A:
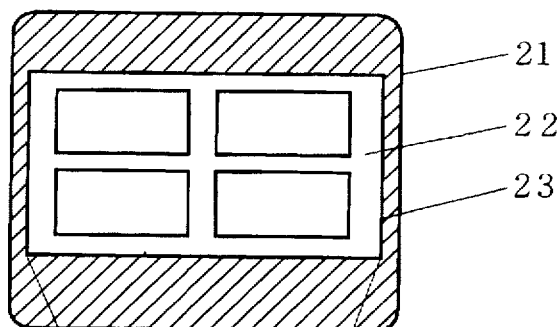
FIGS. 4A and 4B illustrate the method of analyzing the failure of the semiconductor device by using the emission microscope according to a fourth preferred embodiment of the present invention.
Figure 4B:
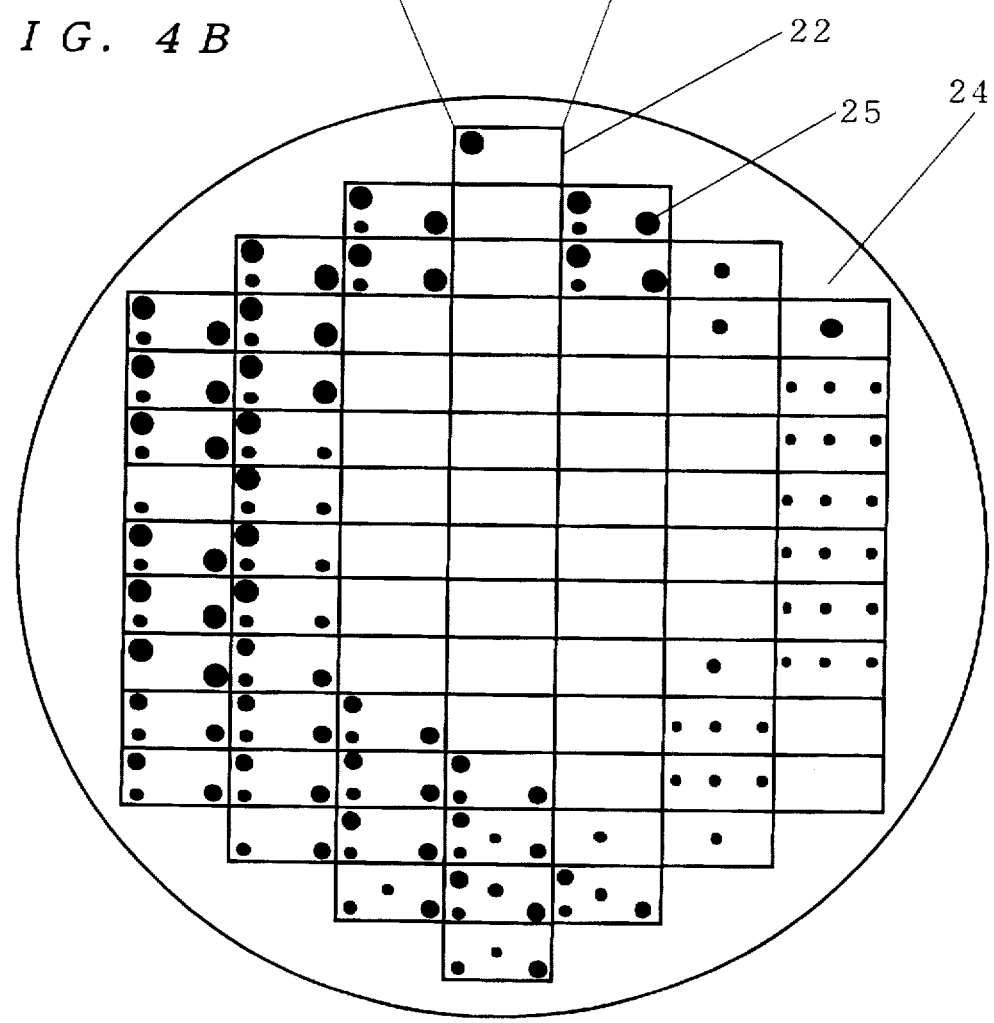

FIGS. 4A and 4B illustrate the method of analyzing the failure of the semiconductor device by using the emission microscope according to a fourth preferred embodiment of the present invention. The hardware arrangement of the fourth preferred embodiment is similar to the conventional hardware arrangement shown in FIG. 8.

The failure analysis method of the fourth preferred embodiment is a method of displaying the light emitting portions for each wafer chip. As illustrated in FIG. 4A, the area of a chip pattern image 22 (optical reflected image) displayed within a light emission measurement visual field 21 may be specified. The reference numeral 23 designates a display target area. The position of each of the chip pattern images 22 on the wafer may be recognized during scanning using the emission microscope.

As illustrated in FIG. 4B, the area-specified chip pattern images 22 are displayed on a reduced scale in units of chip. This provides a light emission wafer map 24 for displaying all of the plurality of chip pattern images 22 on the wafer, with the light emitting portions 25 displayed on the respective chip pattern images 22. The light emitting portions 25 are displayed in varied sizes or colors depending upon the emitted light intensity.

In the failure analysis method of the fourth preferred embodiment, as above described, the light emission wafer map 24 is outputted on the basis of the light emission information stored in the image memory 11, and a current leakage analysis is performed on the basis of the light emission wafer map 24. This allows definite identification of the light emitting portion and intensity distributions within a wafer surface. The light emitting portion distribution within the wafer surface is very effective information for estimation of the cause of current leakage.

The failure analysis method of the fourth preferred embodiment based on the light emission wafer map 24 outputted on the basis of the light emitting portions automatically detected for each chip may substantially enhance the identification of the light emission distribution within the wafer surface which has been difficult to grasp by the conventional light emission distribution for each chip.

<Fifth Preferred Embodiment>

Figure 5:
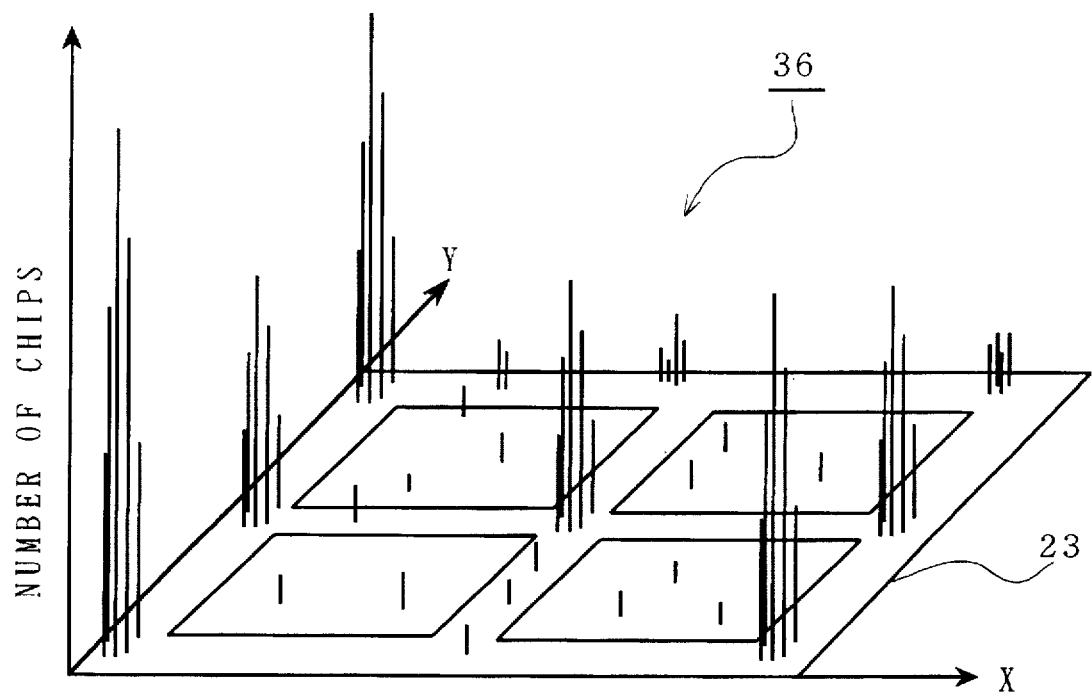
FIG. 5 illustrates the method of analyzing the failure of the semiconductor device by using the emission microscope according to a fifth preferred embodiment of the present invention.

FIG. 5 illustrates the method of analyzing the failure of the semiconductor device by using the emission microscope according to a fifth preferred embodiment of the present invention. The hardware arrangement of the fifth preferred embodiment is similar to the conventional hardware arrangement shown in FIG. 8.

The failure analysis method of the fifth preferred embodiment is a method of displaying the frequency of the light emitting portions on a plurality of wafer chips. More specifically, the light emitting positions of the respective chips are superimposed, and the frequency distribution of the light emitting portions on the plurality of chips is collectively displayed for analysis. It should be noted that the plurality of chips have surfaces of the same configuration.

In the same manner as in the fourth preferred embodiment shown in FIGS. 4A and 4B, the display target area 23 is specified in an area corresponding to one chip, and the light emitting portions detected within the area for all measured chips are accumulated for each plane position coordinate. This provides a frequency map 36 indicative of the frequency distribution of the light emitting portions of all chips as shown in FIG. 5.

The image memory 11 may be utilized for the accumulation. Specifically, the Z coordinates, while being incremented, are written for each chip into the X/Y memory addresses corresponding to the position coordinates at which light emission is detected, permitting the number of chips in which light emission is detected at the same plane position to be stored as Z-direction data.

The frequency map 36 illustrated in FIG. 5 indicates the distribution of the light emitting portions within all of the measured chips, allowing identification of the positional characteristics of the light emitting portions at a glance. It is very important to find the positional characteristics of the light emitting portions within the plurality of chips in order to specify the cause of current leakage.

For example, if the frequency map 36 indicates a random frequency distribution within a chip, the current leakage is supposed to result from particles. If the frequency map 36 exhibits a specific distribution, the current leakage is supposed to result from the chip structure and circuit.

The failure analysis method of the fifth preferred embodiment, as above described, accumulates the light emitting positions for all measured chips to generate the frequency map 36 collectively displaying the accumulation result to analyze the frequency distribution in the frequency map 36, permitting substantially easy identification of the positional characteristics of the current leakage portions.

<Sixth Preferred Embodiment>

Figure 6A:
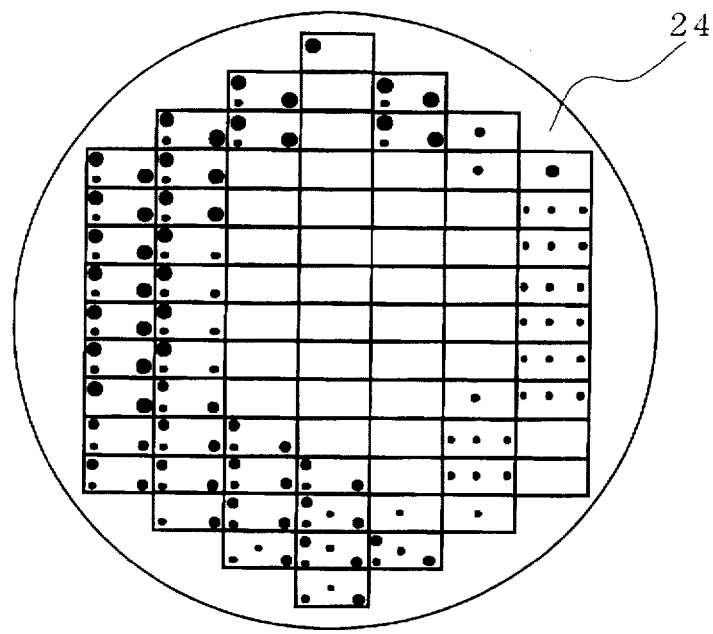
FIGS. 6A and 6B illustrate the method of analyzing the failure of the semiconductor device by using the emission microscope according to a sixth preferred embodiment of the present invention.
Figure 6B:
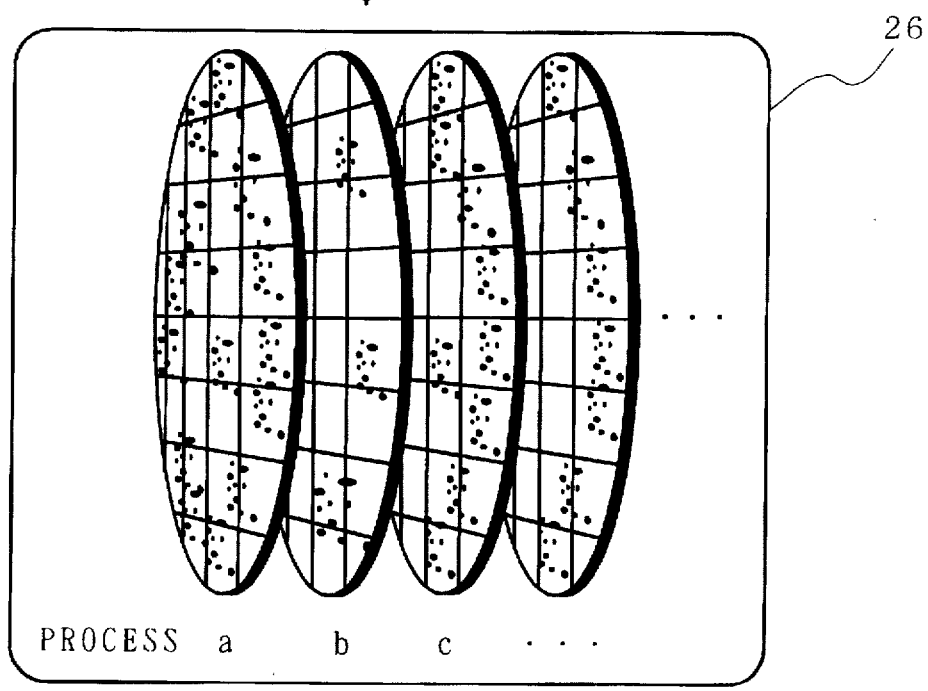

FIGS. 6A and 6B illustrate the method of analyzing the failure of the semiconductor device by using the emission microscope according to a sixth preferred embodiment of the present invention. The hardware arrangement of the sixth preferred embodiment is similar to the conventional hardware arrangement shown in FIG. 8.

The failure analysis method of the sixth preferred embodiment is a method of comparing the light emission wafer map used in the failure analysis method of the fourth preferred embodiment with a defect wafer map provided for each manufacturing process for analysis. More specifically, a comparison is made between the light emission wafer map 24 shown in FIG. 6A and a group of defect wafer maps 26 shown in FIG. 6B for failure analysis. The defect wafer maps 26 are wafer maps displaying "defects" including particles and pattern defects detected by an existing defect check device in the respective manufacturing processes (process a, process b, and process c, . . . ). In general, the defect check device checks the same wafer for defects in a plurality of manufacturing processes, and the data including the position coordinates and sizes of the individual defects are stored. The defect wafer maps 26 may be displayed on the basis of such data.

In this manner, the failure analysis method of the sixth preferred embodiment compares the light emission wafer map 24 with the defect wafer maps 26 for analysis. Thus, if current leakage results from a defect during a manufacturing process, the position coordinates of the light emission on the light emission wafer map 24 may be verified against the position coordinates of the defects in the respective processes on the defect wafer maps 26, permitting easy identification of the manufacturing process during which a defect has caused the current leakage.

For verification, it is desirable to establish a verification range, with coordinates for comparison located in the center thereof, to perform the analysis on the basis of the verification range in consideration for errors of the light emitting positions on the light emission wafer map 24, errors of the defect positions on the defect wafer maps 26, and in particular the fact that the light emitting position does not necessarily correspond to the current leakage position.

<Seventh Preferred Embodiment>

Figure 7:
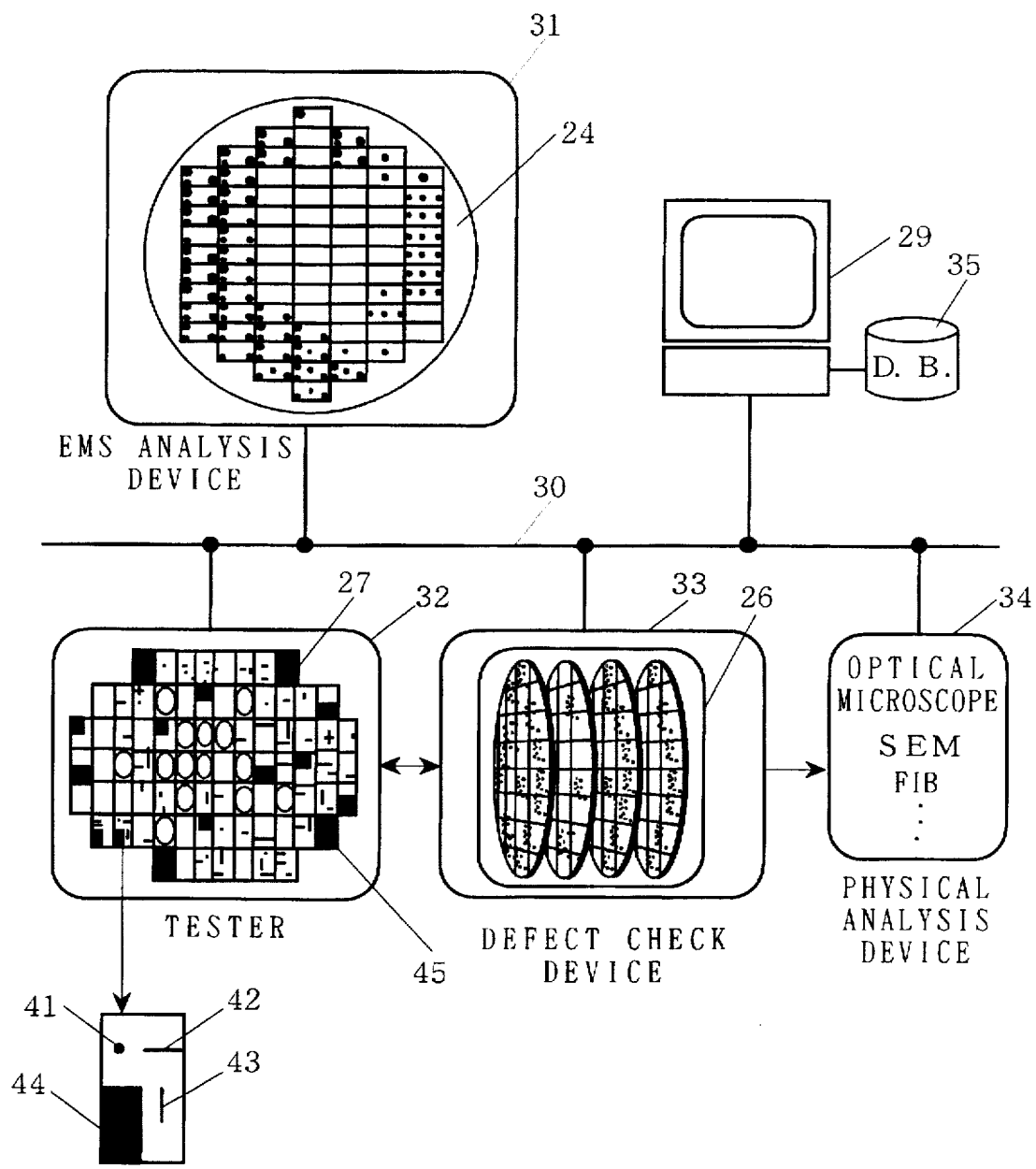
FIG. 7 illustrates a system for analyzing a failure of a semiconductor device by using an emission microscope according to a seventh preferred embodiment of the present invention.

FIG. 7 illustrates a system for analyzing a failure of a semiconductor device by using an emission microscope according to a seventh preferred embodiment of the present invention. The hardware arrangement of the seventh preferred embodiment is similar to the conventional hardware arrangement shown in FIG. 8.

The analysis system of the seventh preferred embodiment comprises a computer 29, an EMS analysis device 31 having the function of automatically detecting the light emitting portions, a tester 32, a defect check device 33, and a physical analysis device 34 all of which are on-line connected by a communication cable 30 to provide a network so that data are transmitted between the above described components for general analysis of current leakage of semiconductor devices.

Referring to FIG. 7, the EMS analysis device 31 is capable of outputting the light emission wafer map 24, and the tester 32 is capable of outputting a fail bit map 27. The fail bit map (FBM) 27 indicates the positions of failed bits detected by the tester 32 of the memory. The failed bits are detected as a 1-bit failure 41, an X-line failure 42, a Y-line failure 43, and a block failure 44 in the respective chips.

The defect check device 33 is capable of outputting the defect wafer maps 26. The physical analysis device 34 includes an optical microscope, an SEM (scanning electron microscope), an FIB (focused ion beam device), and the like. The computer 29 has the functions of managing, verifying and analyzing data (including the light emission wafer map 24, the defect wafer maps 26, and the fail bit map 27) between the devices 31 to 34, and displaying the maps 24, 26 and 27. The computer 29 is directly connected to an external memory 35. The communication cable 30 is capable of constructing a network such as Ethernet. For example, the devices 29, 31 to 34 are connected to each other by Ethernet, with TCP-IC used as a protocol, to construct a network.

The data transmitted through the communication cable 30 are the position coordinates on the maps provided as the result of detection by the respective devices. The formats and coordinate systems of the data may be made common to achieve the common position coordinates. These data are stored in the external memory 35 and controlled collectively by the computer 29, and are subjected to the analysis such as verification on the computer 29.

In the past, there has been a network constructed to comprise the tester 32, the defect check device 33, and the physical analysis device 34 for efficient analysis of a failed operation of memory LSI devices.

The network according to the seventh preferred embodiment, however, further comprises the EMS analysis device 31 having the function of automatically detecting the light emitting portions and capable of outputting the light emission wafer map 24. This achieves the comparison and verification between the light emission wafer map 24 and the defect wafer maps 26 as in the sixth preferred embodiment, and the automatic movement of the visual field (stage movement) to the light emission coordinates in the physical analysis device 34, substantially enhancing the analysis of the current leakage.

In the past, the failed operation of the memory LSI device has been analyzed by verifying the coordinates of the failed bit on the fail bit map 27 provided from the tester 32 against the defect coordinates on the defect wafer maps 26 provided by the defect check of the defect check device 33. Since this analysis necessitates the precise verification between both of the coordinates, the memory operation failures to be checked for are failures having no area, such as the 1-bit failure 41, X-line failure 42, and Y-line failure 43, but the failures having a predetermined area and whose position coordinates are not limitable are not to be checked.

In the failure analysis method by the analysis system of the seventh preferred embodiment, however, the comparison may be made between the light emission wafer map 24 and the fail bit map 27 for analysis. Thus, when the failures such as the block failure 44 and all-bit failure 45 occur, the comparison may be made between the light emission wafer map 24 and the fail bit map 27 to permit relatively easy detection of the cause of the current leakage due to the block failure 44 and all-bit failure 45.

The failure analysis method by the analysis system of the seventh preferred embodiment may enhance the analysis efficiency of current leakage and exhibit effects in analysis of the failed operation of the memory LSI device.

While the invention has been described in detail, the foregoing description is in all aspects illustrative and not restrictive. It is understood that numerous other modifications and variations can be devised without departing from the scope of the invention.

I claim:

1. A method of analyzing a failure of a semiconductor device, comprising:
   forming an emission image of said semiconductor device using an emission microscope, said emission image having light emitting portions at positions in the emission image relating to the two-dimensional position of corresponding positions on the semiconductor device;
   storing light emission information in an image memory, said light emission information including data indicating the two-dimensional position of each of said light emitting portions on said emission image and emitted light intensity data associated with each of said light emitting portions on said emission image at each of the two-dimensional positions;
   accessing said image memory to identify and retrieve said light emission information; and
   analyzing a failure of said semiconductor device in the form of a numerical value on the basis of said retrieved light emission information.

2. The method of claim 1, wherein said step of accessing said image memory includes searching and scanning individual predetermined unit scanning areas in said image memory to detect any stored two-dimensional position data and related intensity data of stored light emitting portions.

3. A method of claim 1, wherein said step of accessing said image memory includes searching and scanning stored emitted light intensity data in said image memory in descending order of emitted light intensity relative to a predetermined emitted light intensity to access said two-dimensional position and intensity data relative to any of the stored light emitting portions.

4. A method of claim 1, wherein said semiconductor device includes a plurality of semiconductor devices each of said semiconductor devices having surfaces of the same configuration, and
   wherein said step of analyzing a failure further includes,
      accumulating light emissions data relative to each of said plurality of semiconductor devices on the basis of said light emission information to produce a frequency map for displaying a frequency distribution of light emitting portions having not less than a predetermined emitted light intensity relative to each of said surfaces, and
      analyzing a failure of said plurality of semiconductor devices on the basis of said frequency map.

5. The method of claim 1, wherein said semiconductor device includes a plurality of semiconductor devices formed on a wafer, and said forming an emission image step includes,
   forming emission microscope images of said plurality of semiconductor devices formed on said wafer and providing an identification of the positions of said plurality of semiconductor devices on said wafer, and
   wherein said step of analyzing a failure further includes,
      producing a light emission wafer map for collectively indicating light portions of each of said plurality of semiconductor devices on said wafer on the basis of said light emission information, and
      analyzing a failure of said plurality of semiconductor devices on the basis of said light emission wafer map.

6. The method of claim 5, wherein said step of analyzing a failure of said plurality of said semiconductor devices further includes,
   producing a plurality of defect wafer maps for collectively indicating defects in respective manufacturing processes associated with said wafer, and
   comparing said light emission wafer map with said plurality of defect wafer maps to analyze a failure of said plurality of semiconductor devices.

7. The method of claim 5, wherein said plurality of semiconductor devices include a plurality of semiconductor memories, and
   wherein said step of analyzing a failure of said plurality of semiconductor devices includes,
      producing a fail bit map for collectively indicating failed bits of said plurality of semiconductor memories on said wafer, and
      comparing said light emission wafer map with said fail bit map to analyze a failure of said plurality of semiconductor memories.

8. A method of analyzing a failure of a plurality semiconductor devices on a wafer by using an emission microscope, said method comprising the steps of:
   producing a light emission wafer map for collectively indicating light emissions detected relative to the plurality of semiconductor devices formed on the wafer using said emission microscope;
   producing defect wafer maps collectively indicating defects relative to respective manufacturing processes used to produce the plurality of semiconductor devices on said wafer, said plurality of semiconductor devices including a plurality of semiconductor memories;

producing a fail bit map collectively indicating failed bits of said plurality of semiconductor memories on said wafer; and performing data management of said light emission wafer map, said defect wafer maps, and said fail bit map including verification of two of said light emission wafer map, said defect wafer maps, and said fail bit map by comparing the two with each other using a network interconnection so as to analyze a failure of said plurality of semiconductor devices.

9. A system for analyzing a failure of a semiconductor device on a wafer, comprising:

an analysis device having an emission microscope, said analysis device outputting a light emission wafer map collectively indicating light emissions of a plurality of semiconductor devices formed on the wafer using said emission microscope;

a defect check device outputting defect wafer maps collectively indicating defects in respective manufacturing processes relative to the plurality of semiconductor devices on said predetermined wafer;

said plurality of semiconductor devices including a plurality of semiconductor memories;

a tester outputting a fail bit map collectively indicating failed bits of said plurality of semiconductor memories on said wafer;

a computer performing data management of said light emission wafer map, said defect wafer maps, and said fail bit map including verification of two of said light emission wafer map, said defect wafer maps, and said fail bit map by comparing the two with each other and wherein said emission microscope, said analysis device, said defect check device, said tester and said computer are connected together in a network.

\* \* \* \* \*